(12) United States Patent
Usami

(10) Patent No.: US 6,835,660 B2
(45) Date of Patent: Dec. 28, 2004

(54) METHOD OF MANUFACTURING SEMICONDUCTOR DEVICE HAVING METAL ALLOY INTERCONNECTION THAT HAS EXCELLENT EM LIFETIME

(75) Inventor: Tetsuo Usami, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/697,335

(22) Filed: Oct. 31, 2003

(65) Prior Publication Data

US 2004/0092130 A1 May 13, 2004

(30) Foreign Application Priority Data

Nov. 5, 2002 (JP) .......................................... 2002-321279
Jun. 18, 2003 (JP) .......................................... 2003-173235

(51) Int. Cl.$^7$ .............................................. H01L 21/44
(52) U.S. Cl. ........................................ 438/687; 438/603
(58) Field of Search ................................. 438/584, 603, 438/687

(56) References Cited

U.S. PATENT DOCUMENTS 5,019,234 A * 5/1991 Harper ........................ 438/643

FOREIGN PATENT DOCUMENTS

JP 7-58203 3/1995
JP 9-45688 2/1997

* cited by examiner

Primary Examiner—Michael Tokar
Assistant Examiner—Lisa Kilday
(74) Attorney, Agent, or Firm—Rabin & Berdo, P.C.

(57) ABSTRACT

In a method of manufacturing a semiconductor device of the invention, a substrate insulating film 102 is formed on a semiconductor substrate 100, a barrier layer 104 is formed on the substrate insulating film, an Al—Cu interconnection layer 106 is formed on the barrier layer by sputtering under a condition that the nitrogen concentration in the atmosphere in the sputtering deposition chamber is higher than 12 ppm but lower than 1000 ppm, and then an anti-reflective film 108 is formed on the Al—Cu interconnection layer.

16 Claims, 9 Drawing Sheets

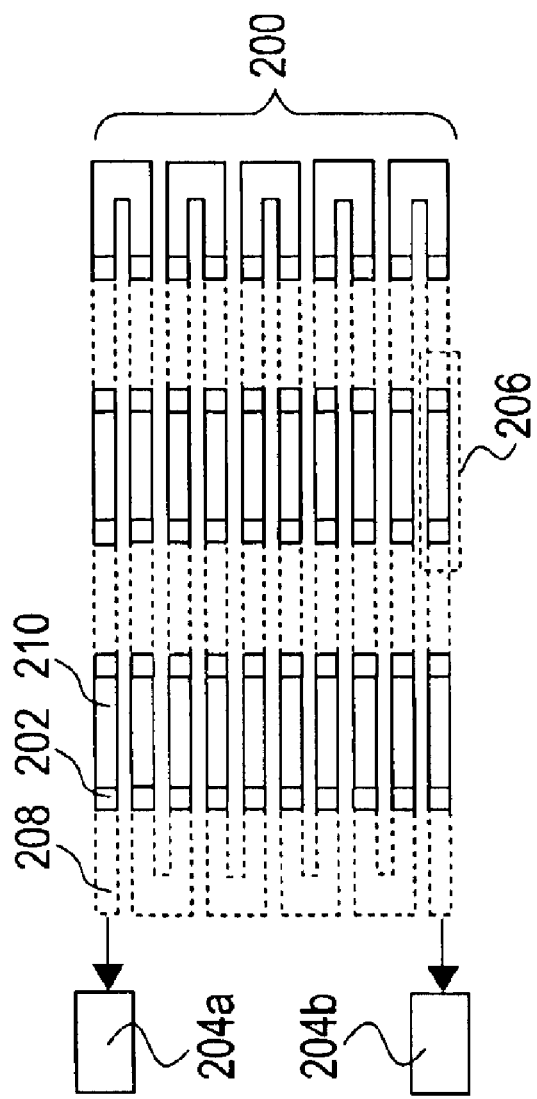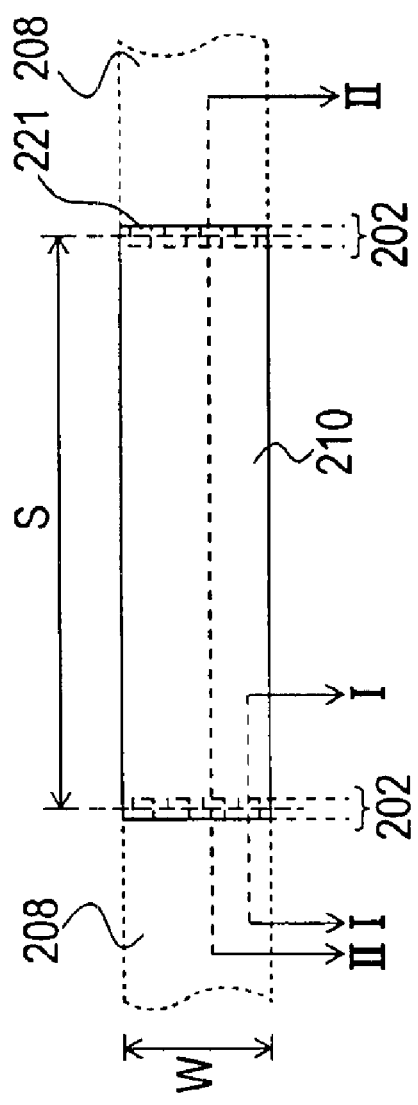
FIG.2(A)
FIG.2(B)

METHOD OF MANUFACTURING SEMICONDUCTOR DEVICE HAVING METAL ALLOY INTERCONNECTION THAT HAS EXCELLENT EM LIFETIME

BACKGROUND OF THE INVENTION

1. Field of the Invention

The invention relates to a method of manufacturing a semiconductor device such as a semiconductor storage device, and in particular to a method of forming multilayer interconnection comprising metal alloy interconnection that has an excellent EM lifetime (EM resistance).

2. Description of Related Art

In general, interconnection layers made of metal alloys are widely used in semiconductor devices. In particular, aluminum alloys (Al alloys) are widely used as interconnection materials, due to having low electrical resistance and being excellent in terms of workability.

It is known that, in a semiconductor device manufacturing process, if nitrogen gas is present when depositing an Al alloy interconnection layer, then the Al crystal grain size will be reduced, and voids will become prone to occurring in the Al alloy interconnection layer. As a result, the film quality drops. Consequently, when depositing an Al alloy interconnection layer by sputtering, the deposition has been carried out with it being a condition that the atmosphere in the deposition chamber substantially does not contain nitrogen.

It is known that in the case that an Al alloy interconnection layer is nitrided, the electrical resistance increases, and hence defects in electrical continuity are brought about.

In recent, there have been advances in making the interconnection in semiconductor devices yet finer and thinner. As a result, the cross-sectional area of the interconnection becomes smaller, and hence the current density increases. With interconnection formed using a conventional Al alloy interconnection formation method, as the current density increases, the electromigration (EM) lifetime becomes shorter. As a result, a problem of the reliability of the manufactured semiconductor device dropping arises.

Consequently, a method of forming Al alloy interconnection layers, in particular Al—Cu interconnection layers, which have been used in many semiconductor devices in recent years, having an excellent EM lifetime is desired.

The inventors involved in the present application thus carried out assiduous studies into what effects nitrogen getting in has on the EM lifetime of the formed interconnection when forming an Al alloy interconnection layer, and as a result arrived at the conclusion that if an Al alloy interconnection layer is formed in the presence of a small amount of nitrogen gas in the atmosphere in the sputtering deposition chamber during deposition, then a semiconductor device having interconnection that has an excellent EM lifetime can be obtained, thus accomplishing the present invention.

SUMMARY OF THE INVENTION

According to a method of manufacturing a semiconductor device of the invention, deposition of a metal interconnection layer is carried out with a nitrogen concentration in an atmosphere in a sputtering deposition chamber made to be higher than 12 ppm but lower than 1000 ppm.

If this is done, then the EM lifetime can be improved compared with the case that an Al—Cu interconnection layer is formed under a condition that the atmosphere in the deposition chamber substantially does not contain nitrogen.

The method of manufacturing a semiconductor device of the present invention can be implemented merely by making a small amount of nitrogen be present in the atmosphere in the deposition chamber when depositing a metal interconnection layer by sputtering in a conventionally used interconnection formation method. The EM lifetime of the formed interconnection layer can thus be improved easily, without requiring an increase in the number of manufacturing steps or a new apparatus.

BRIEF DESCRIPTION OF THE DRAWINGS

The foregoing and other objects, features and advantageous of the present invention will be better understood from the following description taken in connection with the accompanying drawings, in which:

FIG. 2(A) is a schematic plan view of test interconnection from above, and FIG. 2(B) is a schematic plan view of the test interconnection showing a region 206 in FIG. 2(A) enlarged;

DESCRIPTION OF THE PREFERRED EMBODIMENTS

Figure 1A:
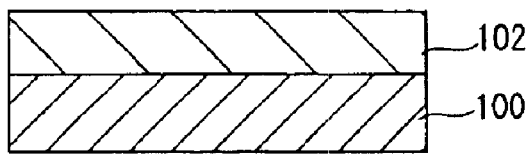
FIGS. 1(A), 1(B), 1(C) and 1(D) are schematic sectional views of a structure at various stages of manufacture, for explaining an interconnection layer formation process of the present invention.

Following is description of preferred embodiments of the present invention, with reference to the drawings. Note that in the drawings, the dimensions and shapes of, and the positional relationships between, the various constituent components are merely shown schematically to an extent that the present invention can be understood. Moreover, the materials used, and the film thicknesses, implantation energies, and other numerical values mentioned in the following are merely examples that are within the scope of the present invention. Moreover, in the drawings, constituent components that are the same as one another are given the same reference numeral, and redundant repeated description is omitted.

(1) Interconnection Layer Formation Method

A description of an interconnection layer formation method according to an embodiment of the present invention will now be given with reference to FIG. 1.

FIGS. 1(A), 1(B), 1(C) and 1(D) are schematic sectional views of a structure at various stages of manufacture, for explaining the semiconductor device interconnection layer formation process of the present invention.

In the following explanation, the interconnection layer formation method is focussed upon; other processes such as a patterning process for forming the interconnection are as in conventional art, and hence detailed description will be omitted.

In the present embodiment, a description will be given of an example in which Al—Cu is used as the material of the metal interconnection layer.

First, a semiconductor substrate 100 is prepared. A substrate insulating film 102 is then deposited on the semiconductor substrate 100 using a publicly known CVD (chemical vapor deposition) method as with conventional art (FIG. 1(A)). The substrate insulating film 102 functions as an insulating film between metal interconnection layers in the case of forming multi-layer interconnection. The substrate insulating film 102 is formed, for example, from P-TEOS (a silicon oxide film formed by plasma CVD using TEOS (tetraethoxysilane) as a raw material gas). As pretreatment, the substrate insulating film 102 is heated for 1 minute at 350° C. This pretreatment is carried out to prevent corrosion of the Al due to degasification from the substrate during the subsequent sputtering. The treatment is carried out at a temperature higher than the temperature in the sputtering step, thus removing moisture and so on from the substrate.

Next, to remove impurities from the surface of the substrate insulating film 102, the substrate insulating film 102 is etched by, for example, approximately 10 nm using sputter etching (this is not shown in the drawings).

Figure 1B:
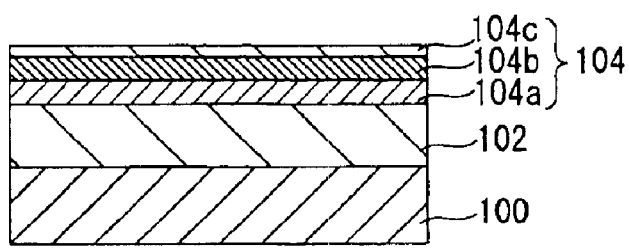

Next, as a barrier layer 104, for example a Ti film 104a is formed to 30 nm, a TiN film 104b is formed to 20 nm, and a Ti film 104c is formed to 5 nm, in this order by a sputtering process (FIG. 1(B)). A titanium (Ti) target is used as the target.

Such a barrier layer 104 is conventionally used with an Al—Cu interconnection layer; the Ti films have an action of improving the orientation of the Al—Cu interconnection layer and thus improving the film quality, and the TiN film has an action of suppressing the reactivity of the Ti to the Al.

Figure 1C:
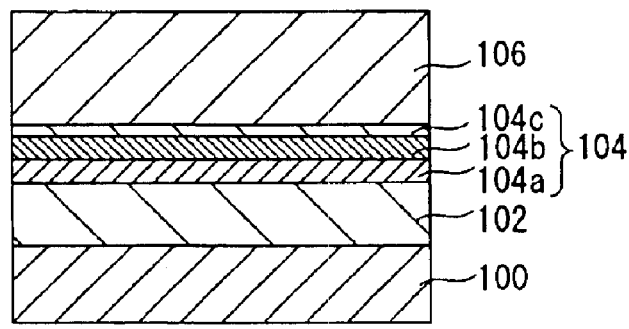

Next, as an Al—Cu interconnection layer, an Al—Cu film 106 is deposited to a thickness of 400 nm through a sputtering process (FIG. 1(C)). The volume of the sputtering deposition chamber at this time should be fixed to be a constant volume during the sputtering deposition. The deposition temperature is made to be, for example, 230° C. Regarding the deposition material, an Al—Cu (Cu content: 0.5 wt %) target can be used. When carrying out the sputtering process, the nitrogen concentration in the deposition chamber is made to be a prescribed nitrogen concentration in advance.

The nitrogen concentration in the atmosphere, i.e. the nitrogen-containing argon gas, in the deposition chamber is preferably made to be higher than 12 ppm but lower than 1000 ppm. This nitrogen concentration is more preferably made to be in a range of 50 to 500 ppm, yet more preferably in a range of 100 to 250 ppm. If the nitrogen concentration in the atmosphere, i.e. the nitrogen-containing argon gas, in the deposition chamber is controlled to be within such a range, then the EM lifetime can be improved.

The nitrogen concentration in the atmosphere, i.e. the nitrogen-containing argon gas, in the deposition chamber can be controlled by regulating the flow rate of argon gas and the flow rate of nitrogen-added argon gas.

According to the semiconductor device manufacturing method of the present invention, the nitrogen concentration in the atmosphere, i.e. the nitrogen-containing argon gas, in the deposition chamber can be easily controlled by regulating the flow rates of argon gas and nitrogen-added argon gas, and hence the EM lifetime of the formed interconnection layer can be improved easily, without requiring an increase in the number of manufacturing steps or a new apparatus.

The nitrogen concentration is regulated through the flow rates of argon (Ar) gas and nitrogen-added Ar gas. Regarding verifying that there is a relationship of proportionality between the nitrogen concentration (units: ppm) in the deposition chamber as calculated from the residual gas partial pressure in the deposition chamber and the equivalent nitrogen flow rate (units: sccm) calculated from the nitrogen-added Ar gas, a description of this will be given later when describing a test interconnection formation method.

In the present embodiment, as the nitrogen-added Ar gas, in the case that the nitrogen concentration in the deposition chamber is less than 200 ppm, Ar gas to which 0.1% (partial pressure proportion) of nitrogen has been added is used, and in the case that the nitrogen concentration in the deposition chamber is at least 200 ppm, Ar gas to which 0.5% (partial pressure proportion) of nitrogen has been added is used. With the test interconnection described later, the test interconnection is formed using Ar gas to which 0.1% of nitrogen has been added in the case that the nitrogen concentration is 57 ppm or 120 ppm, and using Ar gas to which 0.5% of nitrogen has been added in the case that the nitrogen concentration is 207 ppm or 500 ppm.

Figure 1D:
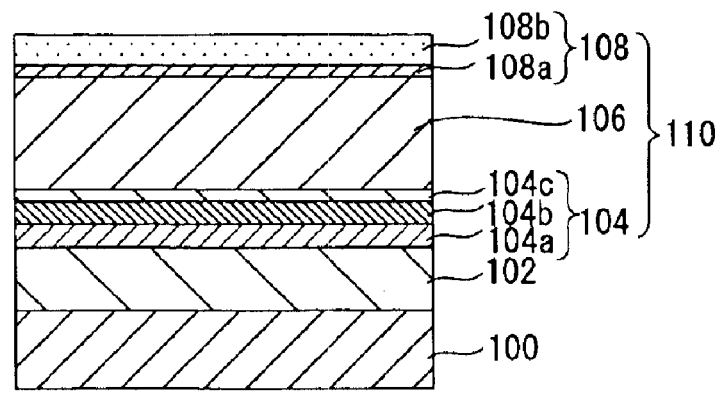

As an anti-reflective film (ARM: anti-reflective material) 108, a Ti film 108a is formed to a thickness of approximately 5 nm, and then a TiN film 108b is formed to a thickness of approximately 50 nm, by a sputtering process on an upper surface of the Al—Cu film 106 (FIG. 1(D)).

A Ti (titanium) target is used as the target in this sputtering process. The anti-reflective film 108 has the same functions as the barrier layer 104 described earlier, and in addition prevents reflection of the exposing light during a process of patterning the interconnection by photolithography/etching.

In this way, an interconnection layer 110 comprising the barrier layer 104, the Al—Cu film 106 and the anti-reflective film 108 is formed. Patterning the interconnection layer 110 into a desired interconnection pattern using a publicly known photolithography/etching technique can then form interconnection.

As is clear from the experimental results described later, the EM lifetime of the Al—Cu interconnection layer of a semiconductor device formed according to the formation method of the present embodiment is improved compared with the case of an Al—Cu interconnection layer obtained using a conventional formation method in which the Al—Cu interconnection layer is formed under a condition that the atmosphere in the deposition chamber substantially does not contain nitrogen, i.e. under a condition that as far as possible nitrogen is made to not be present in the deposition chamber.

Moreover, the interconnection layer formation method of the present embodiment can be implemented merely by making a small amount of nitrogen be present in the deposition chamber when depositing the metal interconnection layer through a sputtering process in a conventionally used interconnection formation method. The EM lifetime of the formed interconnection layer can thus be improved easily, without requiring an increase in the number of manufacturing steps or a new apparatus.

As a method of controlling the nitrogen concentration in the atmosphere in the deposition chamber, a procedure such as the following can be envisaged.

For example, after the uppermost layer of the barrier layer has been formed as a TiN film by carrying out sputtering in nitrogen before the formation of the Al—Cu interconnection layer, the Al—Cu interconnection layer is sputtered with argon gas used as the deposition gas, and the nitrogen concentration in the nitrogen-containing argon gas in the deposition chamber at this time can also be controlled by heating during the sputtering, thus discharging excess nitrogen contained in the TiN film into the deposition chamber.

In this way, it is sufficient to merely carryout the sputtering using only nitrogen as the deposition gas when depositing the TiN film that is the uppermost layer of the barrier layer.

Specifically, the barrier layer is made to have a constitution in which a plurality of Ti and TiN films are formed on top of one another, and the uppermost layer of the barrier layer is made to be a TiN film. When sputtering the TiN film that is the uppermost layer of the barrier layer, the deposition is carried out using only nitrogen as the deposition gas. If the sputtering of the TiN film is carried out using only nitrogen as the deposition gas in this way, then excess nitrogen is taken into the TiN film.

Next, the Al—Cu film is deposited on the TiN film that is the uppermost layer of the barrier layer by sputtering with Ar gas as the deposition gas. By heating at this time, excess nitrogen present in the TiN film is discharged into the deposition chamber.

If this is done, then during the sputtering of the Al—Cu film, the deposition chamber can be made to contain nitrogen without using nitrogen-added Ar gas. The EM lifetime of the formed interconnection layer can thus be improved easily, without requiring an increase in the number of manufacturing steps or a new apparatus.

Control of the nitrogen concentration is carried out through the thickness of the TiN film that is the uppermost layer of the barrier layer, and the deposition temperature during the sputtering of the Al—Cu film. Preferably, this deposition temperature is made to be in a range of 200 to 400° C.

According to this interconnection layer formation method of the present invention, the EM lifetime can be improved compared with the case of forming an Al—Cu interconnection layer under a condition that the atmosphere in the deposition chamber substantially does not contain nitrogen, i.e. under the conventional condition that as far as possible nitrogen is made to not be present in the deposition chamber.

This interconnection layer formation method of the present invention can be implemented merely by carrying out the sputtering using only nitrogen as the deposition gas when depositing a TiN film that is the uppermost layer of a barrier layer in a conventionally used interconnection formation method. The EM lifetime can thus be improved easily, without requiring an increase in the number of manufacturing steps or a new apparatus.

(2) EM Resistance Tests (2-1) Formation Of Test Interconnection

Test interconnection was formed using the metal interconnection layer formation method described above, and cumulative failure rate measurement tests, i.e. EM resistance tests, were carried out on the test interconnection.

FIG. 2(A) is a schematic plan view of the test interconnection from above, and FIG. 2(B) is a schematic plan view of the test interconnection showing a region 206 in FIG. 2(A) enlarged.

The test interconnection comprises two levels of interconnection, with the interconnection being shifted up or down at fixed intervals; the first interconnection layers (referred to as 'M1 layers 208') and the second interconnection layers (referred to as 'M2 layers 210') are connected together by electrically conductive layers (referred to as 'TH layers 221') provided in through holes (TH).

An EM resistance test is carried out by connecting the test interconnection 200 having such an interconnection pattern to electrode pads 204a and 204b and passing a current. In the present example, the up/down direction is the direction perpendicular to the plane of the paper in FIG. 2, and the M1 layers 208 are at a lower level, and the M2 layers 210 are at an upper level. Through hole (TH) formation regions 202 are provided so as to connect the M1 layers 208 and the M2 layers 210 together.

The M1 layers (first interconnection layers) 208 are connected to the M2 layers (second interconnection layers) 210 therebetween via the TH layers 221. That is, the test interconnection 200 is constituted through repeated connection of the form M1 layer→TH layer→M2 layer→TH layer→M1 layer.

The test interconnection 200 is formed with an interconnection pattern having an interconnection width W of 2.0 μm, an interconnection length L of 5000 μm, and a number of sites of through hole (TH) installation, i.e. a number of sites of TH layer 221 installation, of 50 (installation spacing S: 100 μm). Here, the installation spacing S is the distance between the centers of adjacent THs. Moreover, four TH layers 221 are provided in each through hole formation region 202, with the TH layers 221 being provided in a straight line at equal intervals in the interconnection width direction. The distance between adjacent TH layers 221 is made to be 0.26 μm. The shape of the TH layers 221 when viewed from above is made to be a 0.26 μm×0.26 μm square.

The test interconnection formation was divided into first interconnection tests (run 1) and second interconnection tests (run 2), to allow switching over of the gas cylinder that introduces the nitrogen-added Ar gas into the deposition chamber.

Run 1 consisted of tests for the case that the nitrogen concentration in the atmosphere in the deposition chamber is less than 200 ppm. In this case, a cylinder of Ar to which 0.1% (partial pressure proportion) of nitrogen had been added was used. Similarly, run 2 consisted of tests for the case that the nitrogen concentration in the atmosphere in the deposition chamber is at least 200 ppm. In this case, a cylinder of Ar to which 0.5% (partial pressure proportion) of nitrogen had been added was used.

Figure 3A:
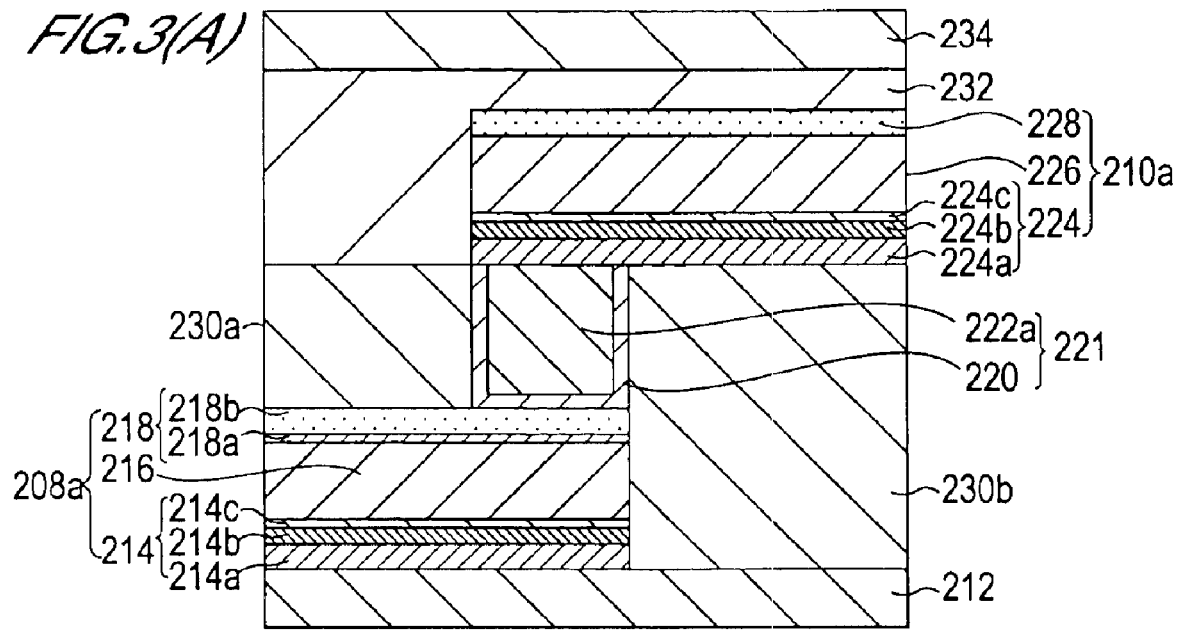
FIG. 3(A) is a schematic sectional view of test interconnection of run 1 showing a section along I—I in FIG. 2(B)
Figure 3B:
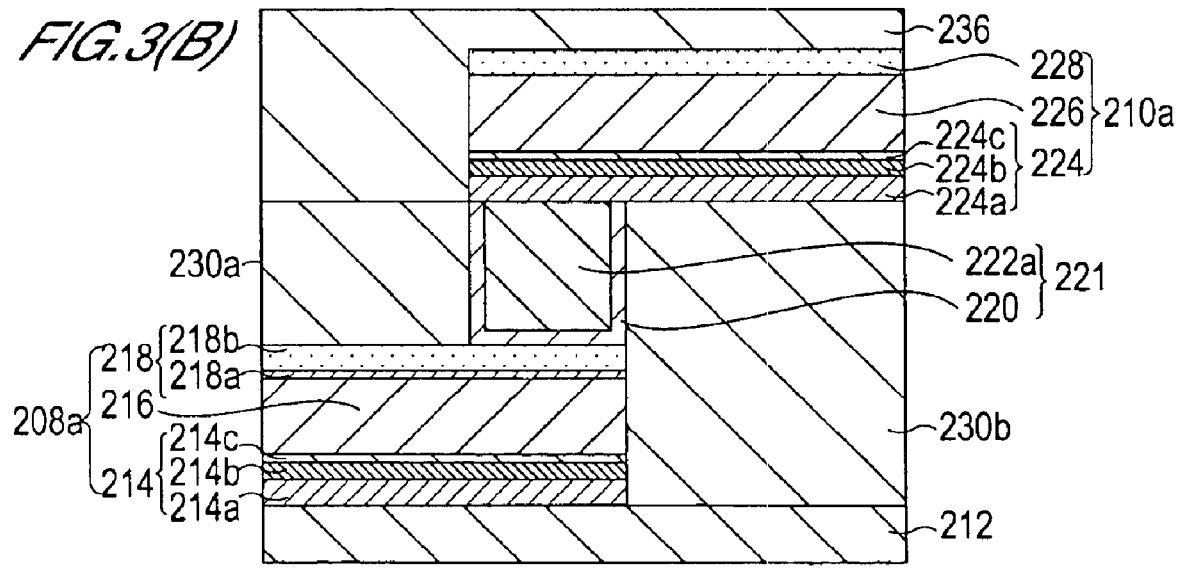
FIG. 3(B) is a schematic sectional view of test interconnection of run 2 showing a section along I—I in FIG. 2(B)

FIG. 3(A) is a schematic sectional view of the test interconnection of run 1 showing a section along I—I in FIG. 2(B). FIG. 3(B) is a schematic sectional view of the test interconnection of run 2 showing a section along I—I in FIG. 2(B).

The structure of the test interconnection of run 1 will now be described using FIG. 3(A). In the test interconnection, a patterned M1 layer 208a is formed on a substrate oxide film 212. The M1 layer 208a is connected to a patterned M2 layer 210a in an upper layer by a TH layer 221. The M1 layer 208a is constituted through a barrier layer 214, an Al—Cu film 216 and an anti-reflective film 218 being formed on top of one another in this order from a lower layer upward. The barrier layer 214 is constituted through a first Ti film 214a, a TiN film 214b and a second Ti film 214c being formed on top of one another in this order from a lower layer upward. The anti-reflective film 218 is constituted through a Ti film 218a and a TiN film 218b being formed on top of one another in this order from a lower layer upward. In the TH layer 221, a barrier metal 220 covers a bottom face and side faces of a tungsten plug (hereinafter referred to as 'W plug') 222a.

In the M2 layer 210a, a barrier layer 224, an Al—Cu film 226 and an anti-reflective film 228 are formed on top of one another in this order from a lower layer upward. In the barrier layer 224, a first Ti film 224a, a TiN film 224b and a second Ti film 224c are formed on top of one another in this order from a lower layer upward. The anti-reflective film 228 is made to be a single layer comprising a TiN film, since the only purpose of the anti-reflective film 228 is to prevent reflection during photolitho-etching.

An upper face and a side face of the M1 layer 208a and side faces of the barrier metal 220 are covered by an oxide film 230a and 230b. The oxide film 230a and 230b is actually a single continuous oxide film, but here a thin part, i.e. the part in contact with the upper face of the M1 layer 208a, is given the reference numeral 230a, and a thick part, i.e. the part in contact with an upper face of the substrate oxide film 212, is given the reference numeral 230b. An oxide film 232 is formed so as to cover the oxide film 230a and 230b and the M2 layer 210a. A nitride film 234 is formed over the whole of an upper face of the oxide film 232.

The test interconnection used in run 2 has almost the same structure as in run 1, already described using FIG. 3(A). However, in run 2, the upper layer oxide film 232 is not provided. That is, a nitride film 236 covers the oxide film 230a and 230b and the M2 layer 210a (FIG. 3(B)).

A description of the test interconnection formation process will now be given using FIGS. 4(A) to 4(E) and FIGS. 5(A) to 5(D).

FIGS. 4(A) to 4(E) and FIGS. 5(A) to 5(D) are schematic sectional views of the structure at various stages of manufacture, for explaining the test interconnection formation process. Each of these drawings corresponds to a section along II—II in FIG. 2(B). Note that the deposition conditions for the M1 layers and the M2 layers will be described later.

The nitrogen concentration in the deposition chamber when sputtering the Al—Cu film was controlled by regulating the flow rate of each of Ar gas and nitrogen-added Ar gas.

First, an M1 layer 207 is formed on the substrate oxide film 212, using the same conditions as in the interconnection layer formation method described earlier (FIG. 4(A)). P-TEOS is used for the substrate oxide film 212.

Figure 4A:
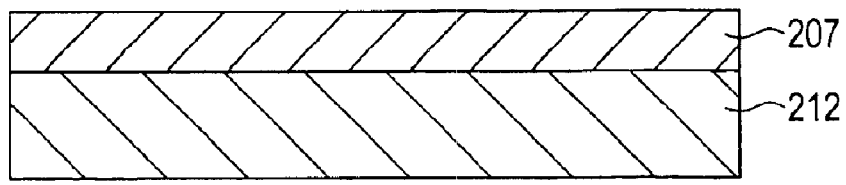
FIGS. 4(A), 4(B), 4(C), 4(D) and 4(E) are schematic sectional views of a structure at various stages of manufacture, for explaining a test interconnection formation process.
Figure 4B:
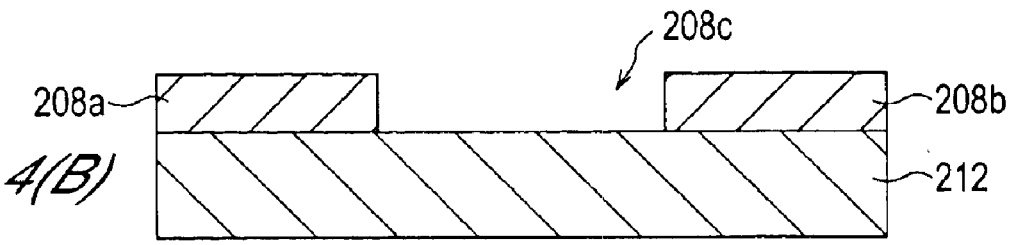
Figure 4C:
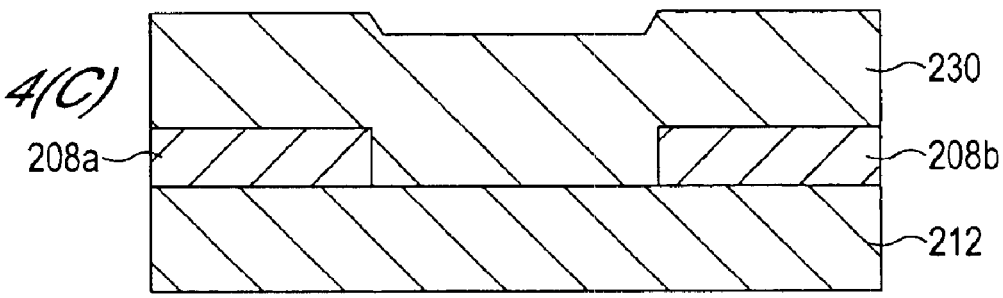
Figure 4D:
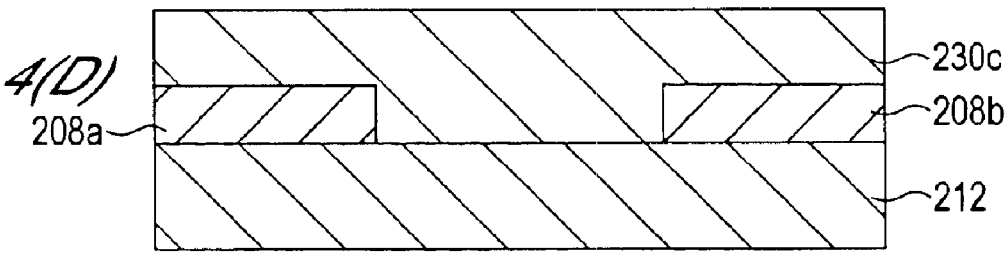

The M1 layer 207 is then patterned using a publicly known photolitho-etching technique such that the pattern when viewed from above becomes the M1 layer 208 parts of the pattern shown in FIG. 2(A) (FIG. 4(B)). Adjacent M1 layer parts that remain after this patterning are represented in FIG. 4(B) by the reference numerals 208a and 208b. A gap between these parts is represented by the reference numeral 208c. It should be noted that the M1 layers 208 extend underneath the TH formation regions 202 in FIG. 2(A). Next, the oxide film 230 is formed, and then flattening is carried out using a publicly known flattening technique (CMP: chemical mechanical polishing) (FIG. 4(C) and FIG. 4(D)).

Figure 4E:
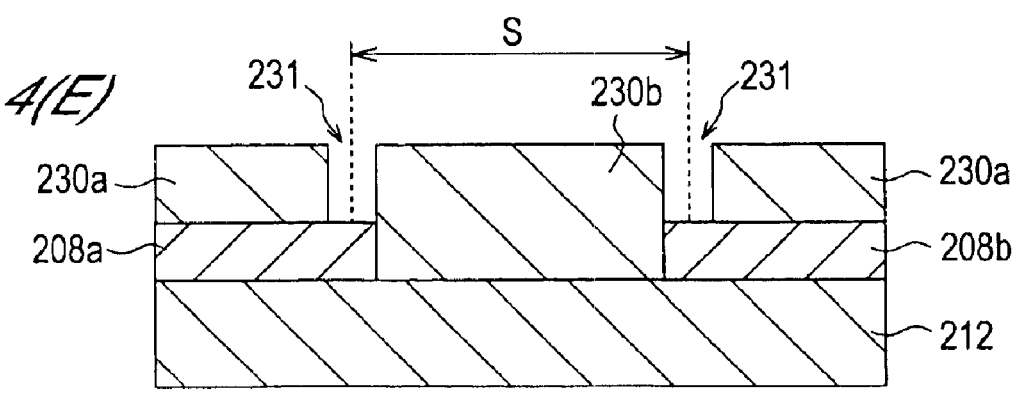

Using a publicly known photolitho-etching technique, regions where THs are to be formed are then formed as openings 231 that reach as far as the surfaces of the M1 layers 208a and 208b (FIG. 4(E)). The distance between the centers of adjacent openings 231 is equal to the TH layer 221 installation spacing S mentioned earlier. In the present example, the openings 231 are provided at mutually facing ends of the M1 layers 208a and 208b.

The barrier metal 220 is then formed as a TiN film through reactive sputtering with nitrogen using a Ti target (not shown in the drawings).

Figure 5A:
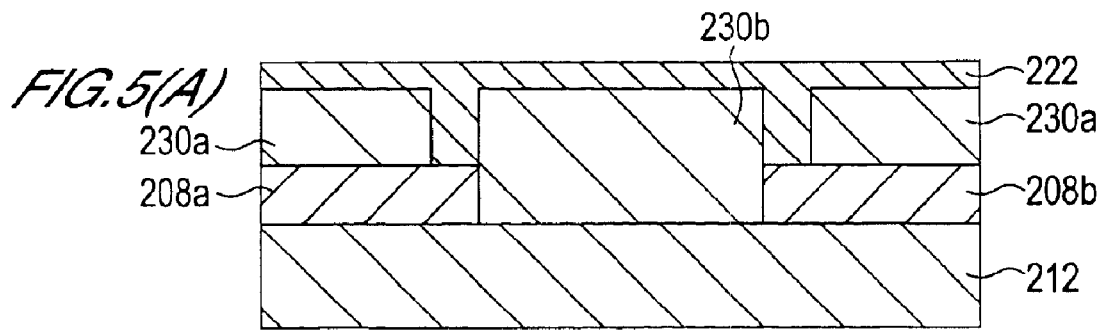
FIGS. 5(A), 5(B), 5(C) and 5(D) are schematic sectional views of the structure at various stages of manufacture, for explaining the test interconnection formation process.

Next, a tungsten (W) film 222 is deposited to a thickness of 700 nm using CVD (FIG. 5(A)). The W film 222 is filled into each of the openings 231.

Figure 5B:
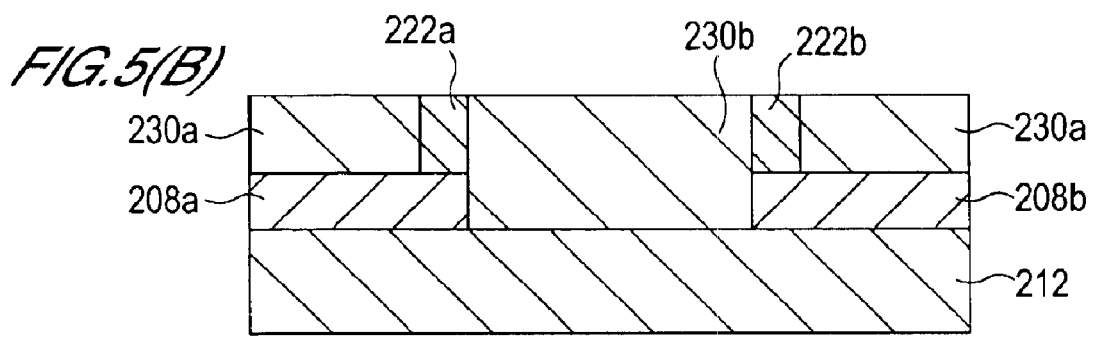

Flattening of the W film 222 down to the surface of the oxide film 230a and 230b is then carried out by CMP, thus forming W plugs 222a and 222b (FIG. 5(B)). These W plugs 222a and 222b are formed from the parts of the tungsten film 222 remaining in the openings 231.

Figure 5C:
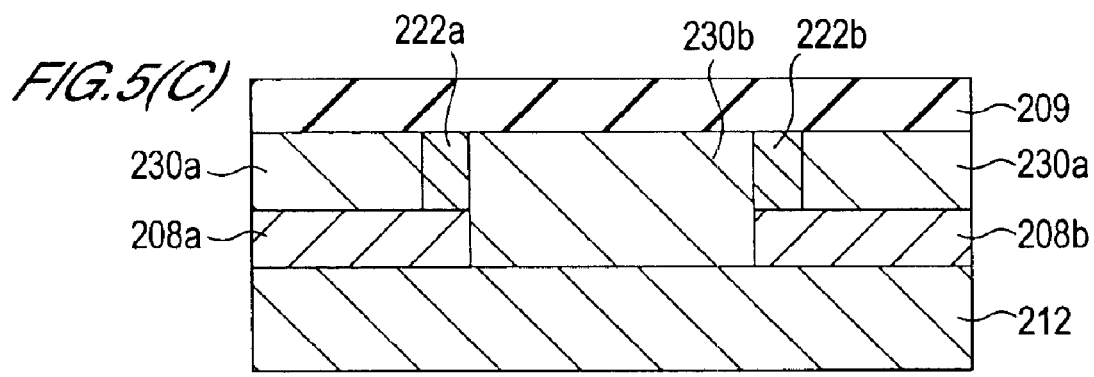
Figure 5D:
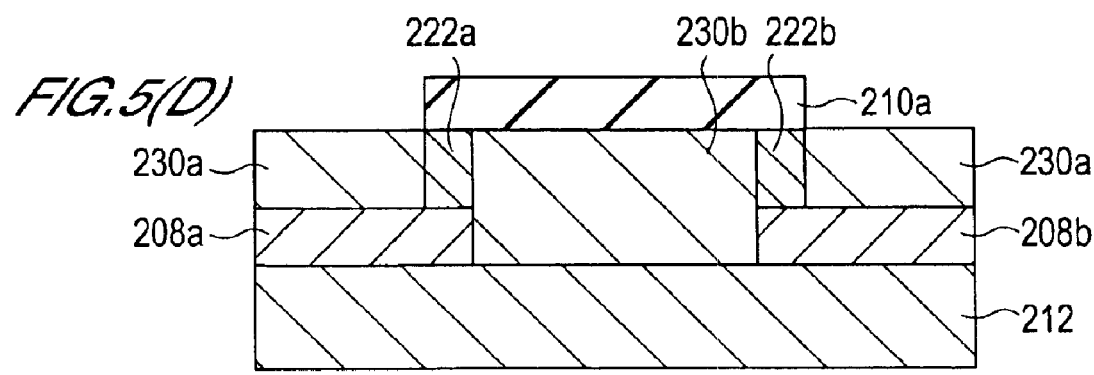

An M2 layer 209 is then formed through the same kind of process as with the M1 layer 207 (FIG. 5(C)). Patterning is then carried out using a publicly known photolitho-etching technique such that the pattern when viewed from above becomes the M2 layer 210 parts shown in FIG. 2(A). An M2 layer part that remains after this patterning is represented by the reference numeral 210a (FIG. 5(D)). Again, it should be noted that the M2 layers 210 extend out over the TH formation regions 202 shown in FIG. 2(A).

Next, in the case of run 1, the oxide film 232 is formed to a thickness of 800 nm by CVD (chemical vapor deposition).

Sintering is then carried out for 30 minutes at 400° C. in a hydrogen gas atmosphere, and then the nitride film 234 is formed to a thickness of 400 nm by plasma CVD, thus completing the formation of the test interconnection.

In the case of run 2, the nitride film 236 is formed to a thickness of 400 nm by plasma CVD, and then sintering is carried out for 30 minutes at 400° C. in a hydrogen gas atmosphere, thus completing the formation of the test interconnection.

The conditions for the sputter etching of the surface of the substrate oxide film and the sputtering of the various layers are shown below. Table 1 shows the deposition conditions for the M1 layers. Table 2 shows the deposition conditions for the M2 layers.

TABLE 1

| M1 layer | Thickness (nm) | Gas flow rates (sccm) | | | Sputtering electrical power (kw) | Deposition temperature (° C.) |
| | | Ar | Heated Ar gas | Nitrogen | | |
| --- | --- | --- | --- | --- | --- | --- |
| Sputter etching | 10 | 40 | 0 | 0 | 0.5 | Room temperature |
| T i N film 214a | 30 | 22 | 10 | 0 | 2 | 300 |
| T i N film 214b | 20 | 10 | 4 | 21 | 3.5 | 300 |
| T i N film 214c | 5 | 32 | 0 | 0 | 1 | 300 |
| Al—Cu film 216 | 400 | X-1 | 15 | 0 | 15 | 225 |
| T i N film 218a | 5 | 22 | 10 | 0 | 1 | 300 |
| T i N film 218b | 50 | 0 | 0 | 32 | 8 | 300 |

TABLE 2

| M1 layer | Thickness (nm) | Gas flow rates (sccm) | | | Sputtering electrical power (kw) | Deposition temperature (° C.) |
|---|---|---|---|---|---|---|
| | | Ar | Heated Ar gas | Nitrogen | | |
| T i N film 224a | 30 | 22 | 10 | 0 | 2 | 300 |
| T i N film 224b | 20 | 10 | 4 | 21 | 3.5 | 300 |
| T i N film 224c | 5 | 32 | 0 | 0 | 1 | 300 |
| Al—Cu film 226 | 400 | ✗1 | 15 | 0 | 15 | 225 |
| T i N film 228 | 50 | 0 | 0 | 32 | 8 | 300 |

As the deposition conditions, the film thickness (nm), the gas flow rates (sccm), the sputtering electrical power (kW), and the deposition temperature (° C.) are shown. The gas flow rates show the flow rates of the gases made to flow into the deposition chamber; 'Ar' is argon gas, and 'nitrogen' is nitrogen gas. Heated Ar gas is argon gas that is made to flow between the wafer and a heater on which the wafer is placed, this being to raise the deposition temperature.

The Ar gas flow rate shown as '·✗·' in each of Tables 1 and 2 varied according to the nitrogen concentration in the deposition chamber, and hence the details are shown in Table 3 and Table 4.

Here, the deposition conditions for the sputtering when forming the Al—Cu film of each test interconnection are shown in Table 3 and Table 4. As the deposition material, an Al—Cu (Cu content: 0.5 wt %) target was used.

TABLE 3

| | | R1 | S1 | LV1 | LV2 |
|---|---|---|---|---|---|
| Nitrogen-added Ar flow rate (sccm) | | 0 | 2.5 | 7 | |
| Equivalent nitrogen flow rate (sccm) | | 0 | 0.0005 | 0.0014 | |
| Ar flow rate (sccm) | | 66 | 64 | 59 | |
| Heated Ar flow rate (sccm) | | 15 | 15 | 15 | |
| Residual gas partial pressures (Pa) | Water | 1.1E−04 | 1.1E−04 | 1.1E−04 | |
| | Nitrogen | 3.6E−06 | 1.7E−05 | 3.6E−05 | |
| | Oxygen | 1.4E−06 | 1.2E−06 | 1.2E−06 | |
| | Ar | 3.0E−01 | 3.0E−01 | 3.0E−01 | |
| Nitrogen concentration (ppm) | | 12 | 57 | 120 | | are shown. The residual gas partial pressure was measured for water ($H_2O$), nitrogen ($N_2$), oxygen ($O_2$) and argon (Ar). The nitrogen concentration was calculated from the nitrogen residual gas partial pressure (also referred to as the 'nitrogen partial pressure') and the Ar residual gas partial pressure ('Ar partial pressure') from the following equation. Nitrogen concentration (ppm)=(nitrogen partial pressure (Pa)/Ar partial pressure (Pa))×$10^6$.

It was verified that there is a relationship of proportionality between the nitrogen concentration calculated from the partial pressures and the equivalent nitrogen flow rate. The results are shown as graphs in FIGS. 6 and 7.

Figure 6:
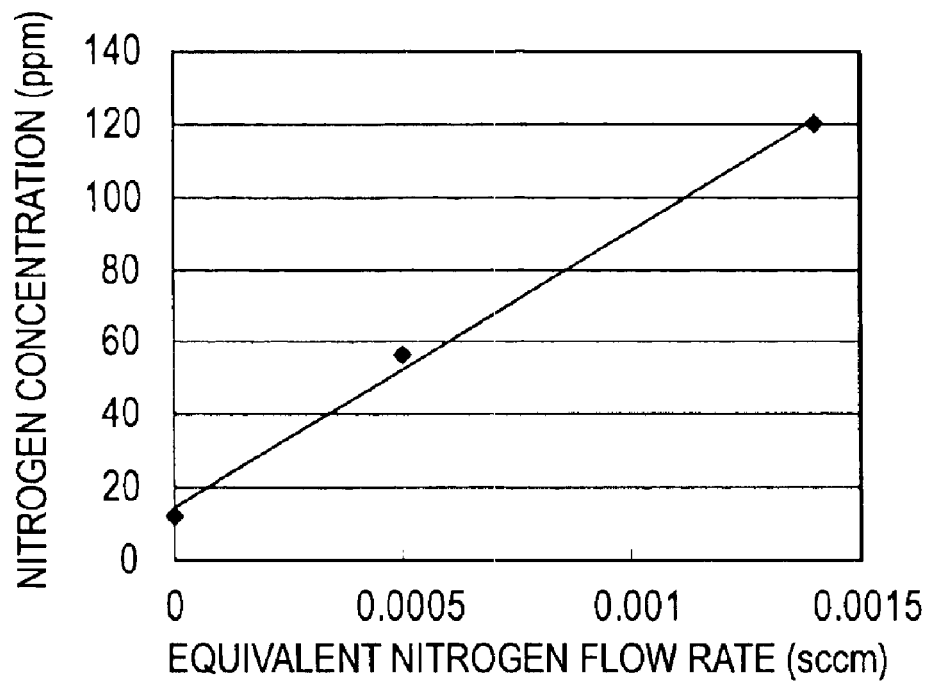
FIG. 6 is a graph showing the relationship between nitrogen concentration and equivalent nitrogen flow rate for run 1.
Figure 7:
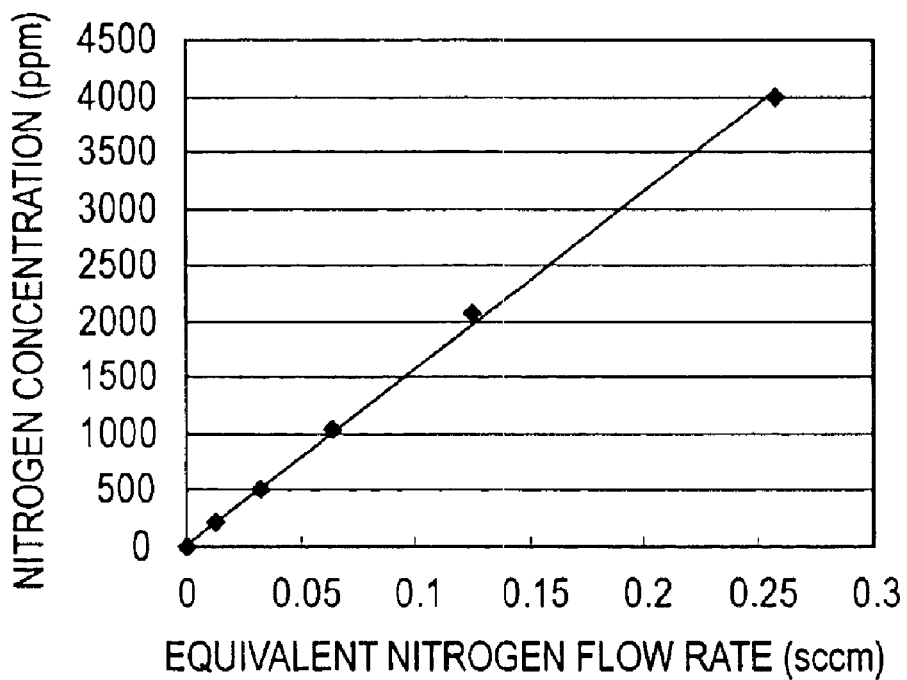
FIG. 7 is a graph showing the relationship between nitrogen concentration and equivalent nitrogen flow rate for run 2.

The horizontal axis shows the equivalent nitrogen flow rate (sccm) and the vertical axis shows the nitrogen concentration (ppm). FIG. 6 shows the results for run 1, and FIG. 7 shows the results for run 2.

For both graphs, the shape is virtually a straight line that rises from left to right. From these measurement results, it can be seen that that there is a relationship of proportionality between the equivalent nitrogen flow rate and the nitrogen concentration. It was thus confirmed that the nitrogen concentration can be controlled by changing the equivalent nitrogen flow rate.

As shown in Tables 3 and 4, by making the Ar gas of Tables 1 and 2 be nitrogen-added Ar gas, the nitrogen concentration in the atmosphere in the sputtering chamber was set to a value in a range of 10 ppm to 4000 ppm, and test interconnection was formed. In run 1, the test interconnection was formed under three conditions, S1 (nitrogen concentration in atmosphere in sputtering chamber 12 ppm),

TABLE 4

| R2 | S2 | LV3 | LV4 | LV5 | LV6 | LV7 |
|---|---|---|---|---|---|---|
| Nitrogen-added Ar flow rate (sccm) | 0 | 2.5 | 6.4 | 12.7 | 25 | 51.5 |
| Equivalent nitrogen flow rate (sccm) | 0 | 0.0125 | 0.032 | 0.0635 | 0.125 | 0.2575 |
| Ar flow rate (sccm) | 66 | 64 | 59 | 50 | 34 | 5 |
| Heated Ar flow rate (sccm) | 15 | 15 | 15 | 15 | 15 | 15 |
| Residual gas partial pressures (Pa) | | | | | | |
| Water | 1.3E−04 | 1.4E−04 | 1.4E−04 | 1.2E−04 | 1.4E−04 | 1.2E−04 |
| Nitrogen | 2.9E−06 | 6.2E−05 | 1.5E−04 | 3.1E−04 | 6.2E−04 | 1.2E−03 |
| Oxygen | 9.6E−07 | 9.4E−07 | 1.2E−06 | 8.4E−07 | 8.1E−07 | 8.5E−07 |
| Ar | 3.0E−01 | 3.0E−01 | 3.0E−01 | 3.0E−01 | 3.0E−01 | 3.0E−01 |
| Nitrogen concentration (ppm) | 10 | 207 | 500 | 1033 | 2067 | 4000 |

The conditions for the first interconnection tests (run 1), i.e. the conditions in the case of a nitrogen concentration of less than 200 ppm, are shown in Table 3, and the conditions for the second interconnection tests (run 2), i.e. the conditions in the case of a nitrogen concentration of at least 200 ppm, are shown in Table 4. In each case, the flow rates of the gases into the deposition chamber (sccm), the residual gas partial pressures (Pa) and the nitrogen concentration (ppm)

LV1 (57 ppm) and LV2 (120 ppm). Similarly, in run 2, the test interconnection was formed under six conditions, S2 (nitrogen concentration in atmosphere in sputtering chamber 10 ppm), LV3 (207 ppm), LV4 (500 ppm), LV5 (1033 ppm), LV6 (2067 ppm) and LV7 (4000 ppm).

With S1 (nitrogen concentration 12 ppm) of run 1 and S2 (nitrogen concentration 10 ppm) of run 2, the nitrogen-added Ar gas was not used, and the sputtering was carried out with the atmosphere made to substantially not contain nitrogen; nevertheless, approximately 12 ppm of nitrogen was unavoidably present in the atmosphere in the sputtering chamber. Consequently, when judging whether or not the EM lifetime of the test interconnection has improved, for LV1 and LV2, S1 is used as a standard representing the condition that the atmosphere in the sputtering chamber substantially does not contain nitrogen, and for LV3 to LV7, S2 is used as a standard representing the condition that the atmosphere in the sputtering chamber substantially does not contain nitrogen.

(2-2) Measurement of EM Resistance

Cumulative failure rate measurement tests were carried out on the test interconnection of above-mentioned S1, S2 and LV1 to LV7.

In the measurement tests, the cumulative failure rate was investigated, with test interconnection for which the resistance had increased by 10% compared with the initial resistance being considered to have failed (i.e. the EM lifetime being considered to have been reached). The test conditions were a testing temperature of 200° C., and a current density of $1.0E6A/cm^2$.

Figure 8:
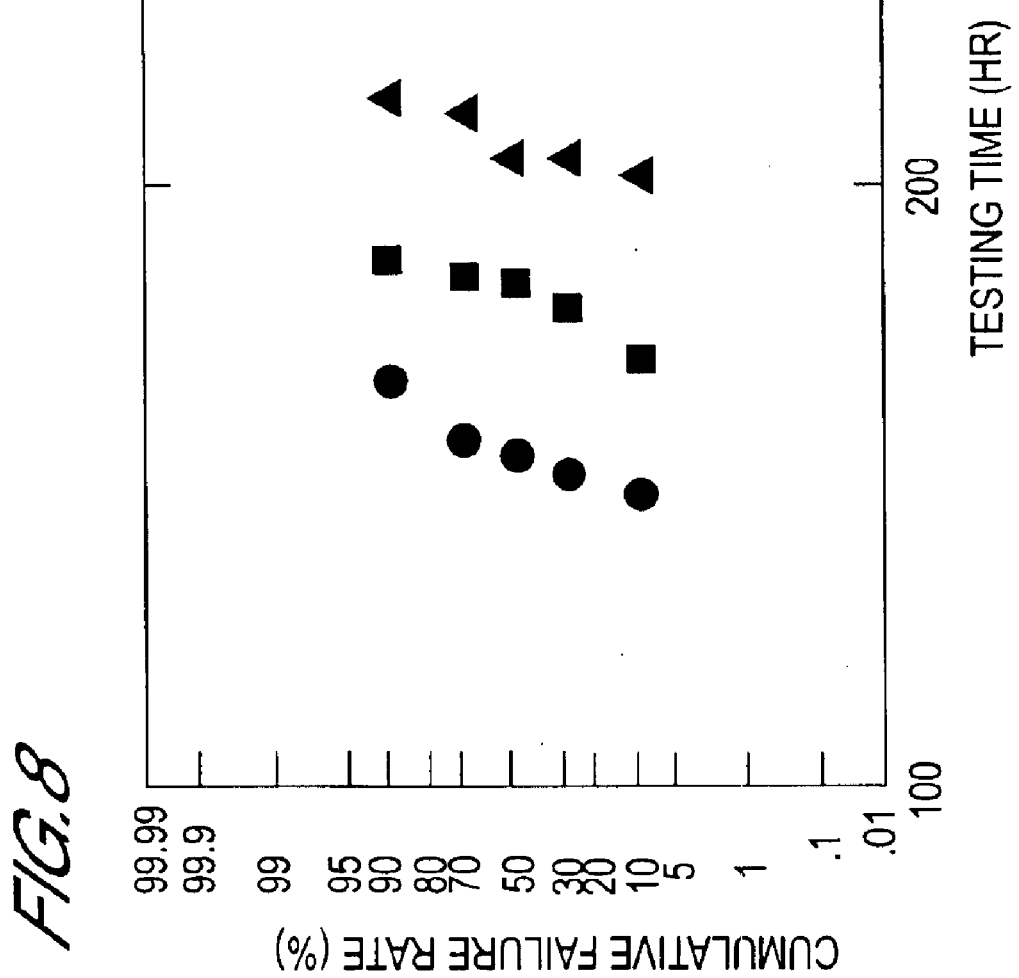
FIG. 8 is a diagram showing results of cumulative failure rate for run 1.
Figure 9:
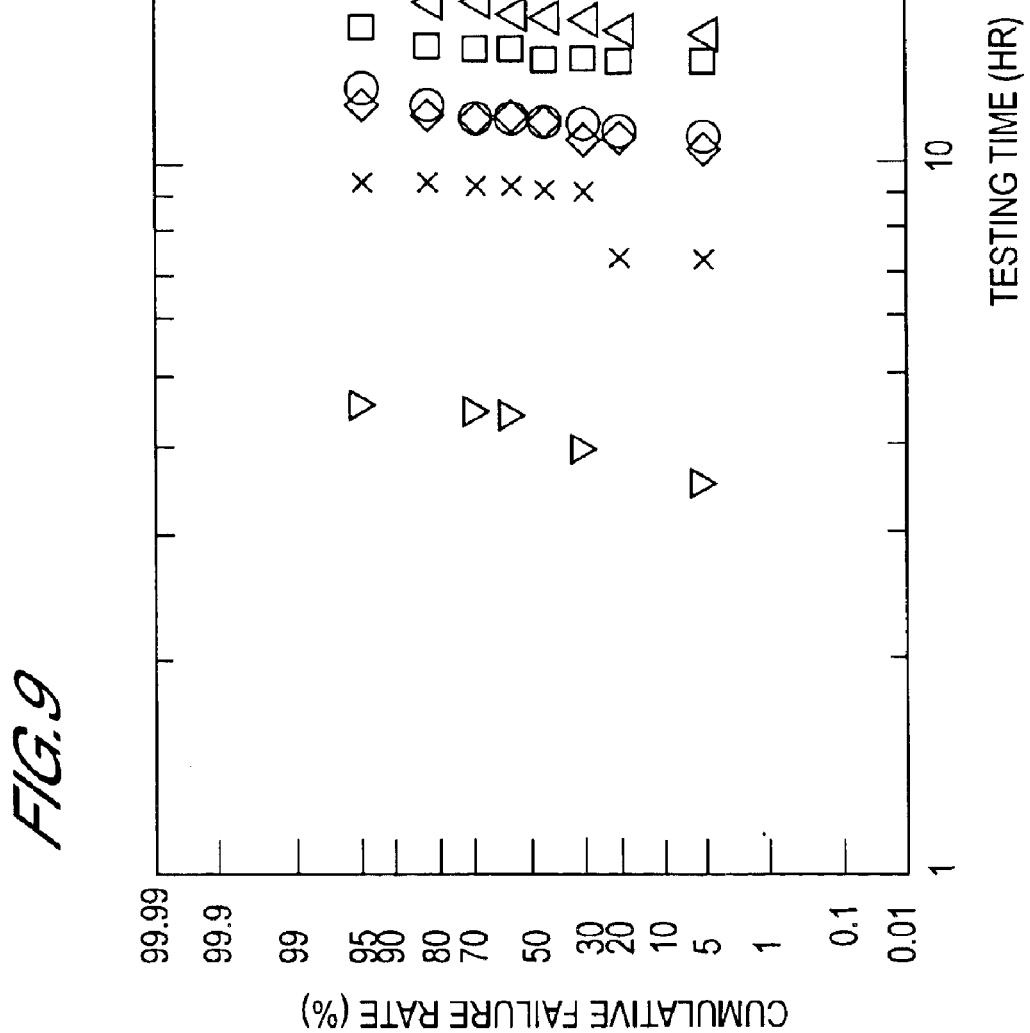
FIG. 9 is a diagram showing results of cumulative failure rate for run 2.

FIG. 8 shows the cumulative failure rate test results for run 1, and FIG. 9 shows the cumulative failure rate test results for run 2. The horizontal axis show the testing time (units: hr), and the vertical axis shows the cumulative failure rate (units: %)

It can be seen from FIG. 8 that the cumulative failure rate for the test interconnection of S1 reached 10% at approximately 139 hours, 50% at approximately 146 hours, and 90% at approximately 158 hours. The cumulative failure rate for the test interconnection of LV1 reached 10% at approximately 163 hours, 50% at approximately 177 hours, and 90% at approximately 181 hours. The cumulative failure rate for the test interconnection of LV2 reached 10% at approximately 201 hours, 50% at approximately 204 hours, and 90% at approximately 219 hours.

It can be seen from FIG. 9 that the cumulative failure rate for the test interconnection of S2 reached 5% at approximately 10.4 hours, 50% at approximately 11.4 hours, and 95% at approximately 11.7 hours. The cumulative failure rate for the test interconnection of LV3 reached 5% at approximately 15.0 hours, 50% at approximately 16.0 hours, and 95% at approximately 18 hours. The cumulative failure rate for the test interconnection of LV4 reached 5% at approximately 13.6 hours, 50% at approximately 14.2 hours, and 95% at approximately 15.5 hours. The cumulative failure rate for the test interconnection of LV5 reached 5% at approximately 10.8 hours, 50% at approximately 11.5 hours, and 95% at approximately 12.7 hours. The cumulative failure rate for the test interconnection of LV6 reached 5% at approximately 7.2 hours, 50% at approximately 9.1 hours, and 95% at approximately 9.3 hours. The cumulative failure rate for the test interconnection of LV7 reached 5% at approximately 3.5 hours, 50% at approximately 4.2 hours, and 95% at approximately 4.5 hours (FIG. 9).

With run 1, it can be seen that the time until failure occurs was longer, i.e. the EM lifetime was longer, for both LV1 and LV2 than for S1. With run 2, it can be seen that the time until failure occurs was clearly longer, i.e. the EM lifetime was longer, for LV3 and LV4 than for the standard S2.

To show the lengthening of the EM lifetime relative to the standard S1 or S2 in an easy to understand way, the relationship between the MTF increase rate and the nitrogen concentration will now be considered.

The MTF (mean time to failure) is the time (units: hr) taken for the cumulative failure rate to reach 50%, and can be determined from the results shown in FIGS. 8 and 9.

With run 1, the percentage increase in the MTF relative to S1 (the MTF increase rate) was calculated for LV1 and LV2. Similarly, with run 2, the MTF increase rate relative to S2 was calculated for LV3 to LV7.

Table 5 shows the MTF value and the MTF increase rate for each of the nitrogen concentrations. If the MTF increase rate has a positive value, then the MTF has increased, whereas if the MTF increase rate has a negative value, then the MTF has decreased.

TABLE 5

| | Nitrogen concentration (ppm) | MTF (hr) | MTF increase rate (%) |
| --- | --- | --- | --- |
| S1 | 10 | 11.38 | 0 |
| S1 | 12 | 146.0 | 0 |
| LV1 | 57 | 177.6 | 21.64 |
| LV2 | 120 | 204.5 | 40.07 |
| LV3 | 207 | 15.96 | 40.25 |
| LV4 | 500 | 14.21 | 24.87 |
| LV5 | 1033 | 11.46 | 0.70 |
| LV6 | 2067 | 9.13 | −19.77 |
| LV7 | 4000 | 4.17 | −63.36 |

Figure 10:
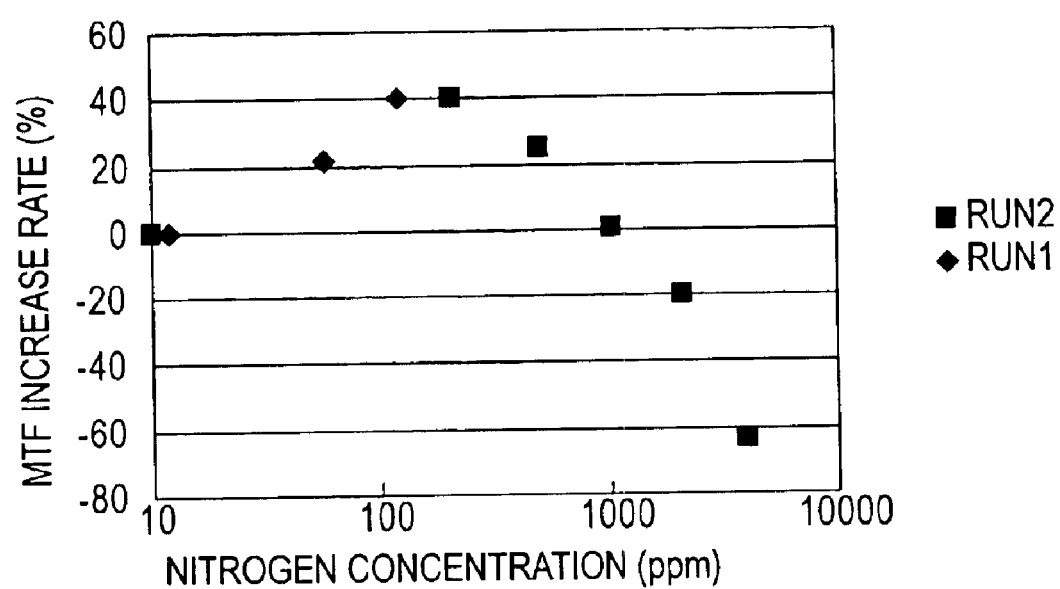
FIG. 10 is a diagram showing the relationship between nitrogen concentration and MTF increase rate.

The relationship between the nitrogen concentration and the MTF increase rate is shown in FIG. 10. The horizontal axis shows the nitrogen concentration in the atmosphere in the deposition chamber (units: ppm). The vertical axis shows the MTF increase rate (units: %).

From the relationship between the MTF increase rate and the nitrogen concentration in the atmosphere in the deposition chamber shown in FIG. 10, it can be seen that with sputtering with a nitrogen concentration exceeding 1000 ppm, the MTF increase rate has a negative value, and hence, as conventionally considered to be the case, the MTF has a lower value than in the case of carrying out the sputtering such that the atmosphere in the deposition chamber substantially does not contain nitrogen. However, in the case that the nitrogen concentration exceeds 12 ppm but does not exceed 1000 ppm, it can be seen that the MTF increase rate has a positive value, and hence the MTF has a higher value than in the case of carrying out the sputtering conventionally such that the atmosphere in the deposition chamber substantially does not contain nitrogen.

In the case that the nitrogen concentration in the atmosphere, i.e. the nitrogen-containing argon gas, in the deposition chamber is in a range of 50 ppm to 500 ppm, an MTF increase rate of more than 20% is exhibited, and hence it can be seen that this range is a preferable concentration range. Moreover, in the case that the nitrogen concentration in the nitrogen-containing argon gas in the deposition chamber is in a range of 100 ppm to 250 ppm, an MTF increase rate of approximately 40% is exhibited, and hence it can be seen that this range is a yet more preferable range.

Consequently, interconnection in which the Al—Cu film has been formed by carrying out sputtering with the nitrogen concentration in the atmosphere in the deposition chamber made to be higher than 12 ppm but lower than 1000 ppm has a higher MTF value, and thus a longer EM lifetime, than conventional interconnection in which the Al—Cu film has been formed according to a conventional method, i.e. by sputtering under a condition that the atmosphere in the deposition chamber substantially does not contain nitrogen.

According to the semiconductor device manufacturing method using the interconnection formation method of the present invention, interconnection having an excellent EM lifetime can be formed.

Moreover, a conventional manufacturing process can be used as is, with the deposition gas merely being made to contain nitrogen when forming the Al—Cu interconnection layer, and hence the EM lifetime can be improved easily, without requiring an increase in the number of manufacturing steps or a new apparatus.

What is claimed is:

1. A method of manufacturing a semiconductor device, comprising;

depositing an Al—Cu interconnection layer with a nitrogen concentration in an atmosphere in a sputtering deposition chamber made to be higher than 12 ppm but lower than 1000 ppm.

2. The method of manufacturing a semiconductor device according to claim 1, wherein the nitrogen concentration in the atmosphere in the sputtering deposition chamber is controlled by introducing nitrogen-containing argon gas into the deposition chamber.

3. The method of manufacturing a semiconductor device according to claim 2, wherein in the case that the nitrogen concentration is made to be less than 200 ppm, the nitrogen concentration is controlled by introducing into the deposition chamber argon gas to which has been added 0.1% of nitrogen as a partial pressure proportion.

4. The method of manufacturing a semiconductor device according to claim 2, wherein in the case that the nitrogen concentration is made to be at least 200 ppm, the nitrogen concentration is controlled by introducing into the deposition chamber argon gas to which has been added 0.5% of nitrogen as a partial pressure proportion.

5. The method of manufacturing a semiconductor device according to claim 1, wherein the nitrogen concentration in the atmosphere in the sputtering deposition chamber is controlled by regulating a flow rate of argon gas and a flow rate of nitrogen-added argon gas.

6. The method of manufacturing a semiconductor device according to claim 5, wherein the nitrogen concentration in the atmosphere in the sputtering deposition chamber is controlled by making a flow rate of heated argon gas be 15 sccm, making the flow rate of the argon gas be at least 50 sccm but less than 66 sccm, and making the flow rate of the nitrogen-added argon gas be more than 0 sccm but not more than 12.7 sccm.

7. A method of manufacturing a semiconductor device, comprising:

forming a substrate insulating film on a semiconductor substrate;

forming a barrier layer on the substrate insulating film;

forming an Al—Cu interconnection layer on the barrier layer by sputtering under a condition that a nitrogen concentration in an atmosphere in a sputtering deposition chamber is higher than 12 ppm but lower than 1000 ppm; and forming an anti-reflective film on the Al—Cu interconnection layer.

8. The method of manufacturing a semiconductor device according to claim 7, wherein the step of forming the barrier layer is a step of forming a first titanium film, a titanium nitride film, and a second titanium film on top of one another in this order.

9. The method of manufacturing a semiconductor device according to claim 8, wherein the forming the anti-reflective film is a forming a titanium nitride film.

10. The method of manufacturing a semiconductor device according to claim 7, wherein the nitrogen concentration in the atmosphere in the sputtering deposition chamber is controlled by introducing nitrogen-containing argon gas into the deposition chamber.

11. The method of manufacturing a semiconductor device according to claim 10, wherein in the case that the nitrogen concentration is made to be less than 200 ppm, the nitrogen concentration is controlled by introducing into the deposition chamber argon gas to which has been added 0.1% of nitrogen as a partial pressure proportion.

12. The method of manufacturing a semiconductor device according to claim 10, wherein in the case that the nitrogen concentration is made to be at least 200 ppm, the nitrogen concentration is controlled by introducing into the deposition chamber argon gas to which has been added 0.5% of nitrogen as a partial pressure proportion.

13. The method of manufacturing a semiconductor device according to claim 10, wherein the nitrogen concentration in the atmosphere in the sputtering deposition chamber is controlled by regulating a flow rate of argon gas and a flow rate of nitrogen-added argon gas.

14. The method of manufacturing a semiconductor device according to claim 10, wherein the nitrogen concentration in the atmosphere in the sputtering deposition chamber is controlled by making a flow rate of heated argon gas be 15 sccm, making a flow rate of argon gas be at least S0 sccm but less than 66 sccm, and making a flow rate of nitrogen-added argon gas be more than 0sccm but not more than 12.7 sccm.

15. A method of manufacturing a semiconductor device, comprising:

forming a substrate insulating film on a semiconductor substrate;

forming, on the substrate insulating film, a barrier layer in which are formed on top of one another a plurality of films including at least a Ti film and at least a TiN film, wherein an uppermost film out of the plurality of films is a TiN film that is formed by carrying out sputtering under a condition that an atmosphere in a sputtering deposition chamber contains nitrogen; and forming, on the barrier layer, an Al—Cu interconnection layer by sputtering under a condition that the atmosphere in the sputtering deposition chamber substantially does not contain nitrogen, while discharging nitrogen into the atmosphere in the sputtering deposition chamber from the TiN film that is the uppermost layer of the barrier layer by regulating a deposition temperature.

16. The method of manufacturing a semiconductor device according to claim 15, wherein when forming the Al—Cu interconnection layer by the sputtering, the deposition temperature is made to be a temperature in a range of 200 to 400° C.

* * * * *